(12) United States Patent
Masuda

(10) Patent No.: US 9,479,136 B2
(45) Date of Patent: Oct. 25, 2016

(54) ELECTRONIC COMPONENT

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/460,439

(22) Filed: Aug. 15, 2014

(65) Prior Publication Data

US 2015/0116056 A1     Apr. 30, 2015

(30) Foreign Application Priority Data

Oct. 30, 2013 (JP) ................................. 2013-225464
Jan. 28, 2014 (JP) ................................. 2014-013288

(51) Int. Cl.
*H03H 7/01* (2006.01)
*H03H 1/00* (2006.01)

(52) U.S. Cl.
CPC .......... *H03H 7/0115* (2013.01); *H03H 7/1708* (2013.01); *H03H 7/1725* (2013.01); *H03H 7/1766* (2013.01); *H03H 2001/0085* (2013.01)

(58) Field of Classification Search
CPC ................... H03H 2001/0085; H03H 7/0115; H03H 7/1766; H03H 7/1725; H03H 7/1708
USPC ................................................. 333/175, 185
See application file for complete search history.

(56) References Cited

U.S. PATENT DOCUMENTS 5,977,845 A    11/1999  Kitahara
6,411,178 B1    6/2002  Matsumura et al.
2002/0163405 A1 * 11/2002 Miyazaki .............. H01P 1/2039
                                                      333/204
2006/0145805 A1    7/2006  Kim et al.
2008/0180192 A1    7/2008  Sakisaka et al.
(Continued)

FOREIGN PATENT DOCUMENTS

EP    2 009 787 A1    12/2008
JP    7-193452 A       7/1995
(Continued)

OTHER PUBLICATIONS

Official Communication issued in corresponding German Patent Application No. 10 2014 219 697.3, mailed on Mar. 5, 2015.
Official Communication issued in corresponding Japanese Patent Application No. 2014-013288, mailed on Dec. 1, 2015.

*Primary Examiner* — Robert Pascal
*Assistant Examiner* — Rakesh Patel
(74) *Attorney, Agent, or Firm* — Keating & Bennett, LLP

(57) ABSTRACT

In an electronic component, first through n-th LC parallel resonators respectively include first through n-th inductors disposed in a device body such that they are sequentially arranged in a first direction in an order from the first inductor to the n-th inductor. The first and the n-th inductors are wound around respective winding axes extending along the first direction. At least one predetermined inductor among the second through the (n−1)-th inductors is wound around a winding axis extending in a second direction which is perpendicular or substantially perpendicular to the first direction. A center of the predetermined inductor in the second direction is positioned toward one side of the second direction with respect to the winding axes of the first and the n-th inductors, as viewed from a plane of the device body in a third direction which is perpendicular or substantially perpendicular to the first and second directions.

18 Claims, 10 Drawing Sheets

(56) References Cited

U.S. PATENT DOCUMENTS

| | | |
|---|---|---|
| 2009/0189714 A1 | 7/2009 | Sakisaka et al. |
| 2010/0033267 A1 | 2/2010 | Mizutani et al. |
| 2010/0171565 A1* | 7/2010 | Okada .................... H03H 7/463 333/132 |
| 2012/0319801 A1* | 12/2012 | Taniguchi ............ H03H 7/0115 333/185 |
| 2013/0009726 A1* | 1/2013 | Sasaki ...................... H03H 7/09 333/185 |

FOREIGN PATENT DOCUMENTS

| | | |
|---|---|---|
| JP | 9-289118 A | 11/1997 |
| JP | 2003-87074 A | 3/2003 |
| JP | 2005-347286 A | 12/2005 |
| JP | 2006-190934 A | 7/2006 |
| JP | 2008-236024 A | 10/2008 |
| JP | 2009-153106 A | 7/2009 |
| JP | 2009-182377 A | 8/2009 |
| WO | 2007/119356 A1 | 10/2007 |

* cited by examiner

ELECTRONIC COMPONENT

BACKGROUND OF THE INVENTION

1. Field of the Invention

The present invention relates to an electronic component, and more particularly, to an electronic component including three or more LC parallel resonators.

2. Description of the Related Art

As a typical example of electronic components of the related art, a three-dimensional spiral inductor disclosed in Japanese Unexamined Patent Application Publication No. 2006-190934 (FIG. 16a) is known. This three-dimensional spiral inductor is a helical coil which is disposed within a multilayer body and which turns around a winding axis extending in a direction substantially orthogonal to a stacking direction of the multilayer body. Such a three-dimensional spiral inductor is used in, for example, a low pass filter.

A low pass filter using three-dimensional spiral inductors is formed by connecting a plurality of LC parallel resonators, each being constituted by a three-dimensional spiral inductor and a capacitor, in series with each other. Since a three-dimensional spiral inductor is formed in a helical shape, the air-core diameter is larger than that of a spiral inductor. It is thus possible to obtain a higher Q factor than a spiral conductor, thus making it possible to reduce the insertion loss of a low pass filter.

In a low pass filter, three-dimensional spiral inductors are arranged linearly such that the winding axes thereof substantially coincide with each other. Because of this arrangement, the three-dimensional spiral inductors are positioned too close to each other, thus enhancing electromagnetic coupling between the three-dimensional spiral inductors. Accordingly, in a low pass filter, the possibility that a high frequency signal is transmitted between three-dimensional spiral inductors is increased, thus failing to obtain a sufficient attenuation in a band other than a pass band of the low pass filter.

SUMMARY OF THE INVENTION

Accordingly, preferred embodiments of the present invention provide an electronic component in which a sufficient attenuation is obtained in a band other than a pass band while insertion loss is reduced.

According to a preferred embodiment of the present invention, an electronic component including a device body and first through n-th LC parallel resonators (n is an integer equal to three or more) connected in series with each other. The first through the n-th LC parallel resonators respectively include first through n-th inductors and first through n-th capacitors. The first through the n-th inductors are disposed in the device body such that they are sequentially arranged in a first direction in an order from the first inductor to the n-th inductor. The first and the n-th inductors turn around respective winding axes extending along the first direction. At least one predetermined inductor among the second through the (n−1)-th inductors turns around a winding axis extending in a second direction which is perpendicular or substantially perpendicular to the first direction. A center of the predetermined inductor in the second direction is positioned toward one side of the second direction with respect to the winding axes of the first and the n-th inductors, as viewed from a plane of the device body in a third direction which is perpendicular or substantially perpendicular to the first and second directions.

According to a preferred embodiment of the present invention, it is possible to obtain a sufficient attenuation in a band other than a pass band while insertion loss is being reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component according to preferred embodiments of the present invention will now be described below with reference to the accompanying drawings.

Figure 1A:
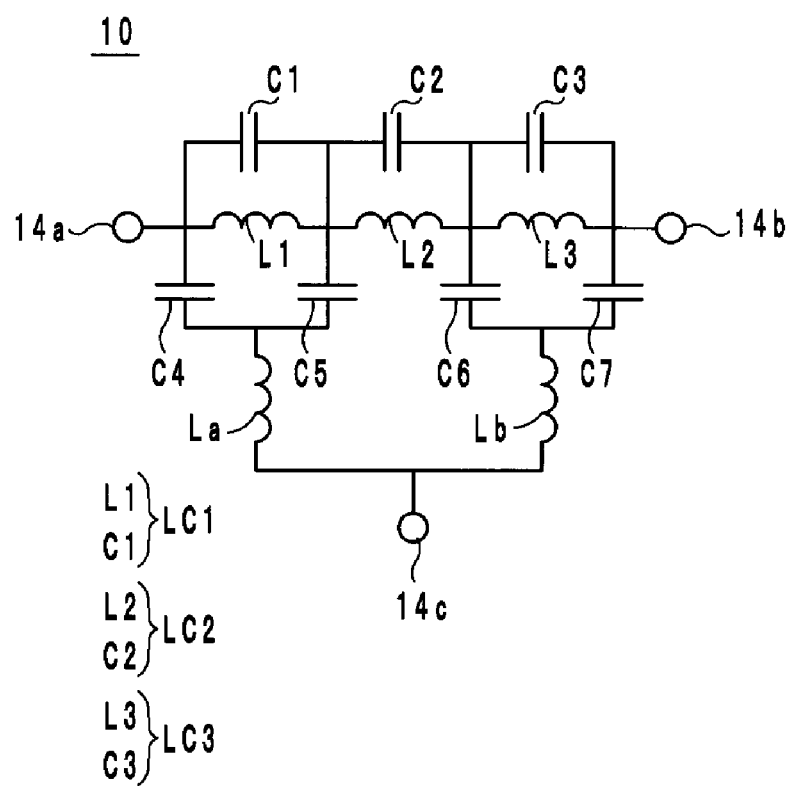
FIG. 1A is an equivalent circuit diagram of an electronic component according to a preferred embodiment of the present invention.
Figure 1B:
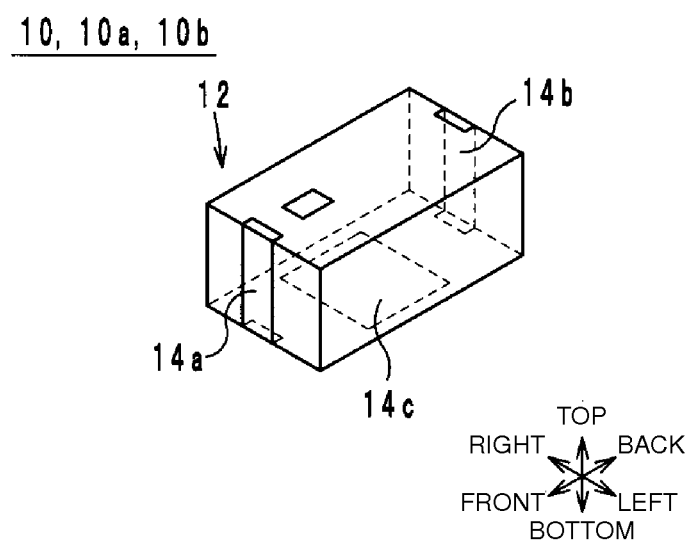
FIG. 1B is an external perspective view of the electronic component shown in FIG. 1A.

The configuration of an electronic component 10 according to a preferred embodiment of the present invention will now be described below with reference to FIGS. 1A through 3. FIG. 1A is an equivalent circuit diagram of the electronic component 10 according to a preferred embodiment of the present invention. FIG. 1B is an external perspective view of the electronic component 10 shown in FIG. 1A. FIGS. 2A through 2D are exploded perspective views of a multilayer body 12 of the electronic component 10. The vertical direction (top-bottom direction) indicates a stacking direction of insulating layers 16. When viewing the electronic component 10 from above, the direction along the long sides of the electronic component 10 is defined as a longitudinal direction (front-back direction), and the direction along the short sides of the electronic component 10 is defined as a widthwise direction (right-left direction). The vertical direction, the longitudinal direction, and the widthwise direction are perpendicular or substantially perpendicular to each other.

The equivalent circuit of the electronic component 10 includes, as shown in FIG. 1A, LC parallel resonators LC1 through LC3, capacitors C4 through C7, inductors La and Lb, and external terminals 14a through 14c. The LC parallel resonator LC1 includes an inductor L1 and a capacitor C1. The LC parallel resonator LC2 includes an inductor L2 and a capacitor C2. The LC parallel resonator LC3 includes an inductor L3 and a capacitor C3. The LC parallel resonators LC1 through LC3 are connected in series with each other in this order between the external terminals 14a and 14b. The resonant frequency of the LC parallel resonator LC2 is lower than that of the LC parallel resonator LC1 and that of the LC parallel resonator LC3.

The capacitor C4 is disposed between a node between the external terminal 14a and the LC parallel resonator LC1 and the external terminal 14c. The capacitor C5 is disposed between a node between the LC parallel resonators LC1 and LC2 and the external terminal 14c. The capacitor C6 is disposed between a node between the LC parallel resonators LC2 and LC3 and the external terminal 14c. The capacitor C7 is disposed between a node between the LC parallel resonator LC3 and the external terminal 14b and the external terminal 14c.

The inductor La is disposed between a node between the capacitors C4 and C5 and the external terminal 14c. That is, the inductor La is connected in series with the capacitors C4 and C5. The inductor Lb is disposed between a node between the capacitors C6 and C7 and the external terminal 14c. That is, the inductor Lb is connected in series with the capacitors C6 and C7.

The electronic component 10 configured as described above is used as a low pass filter. The external terminal 14a is used as an input terminal, the external terminal 14b is used as an output terminal, and the external terminal 14c is used as a ground terminal.

The electronic component 10 includes, as shown in FIGS. 1B and 2A through 2D, the multilayer body 12, the external terminals 14a through 14c, inductor conductors 18a through 18r, 22a through 22o, 26a through 26r, 46, and 48, capacitor conductors 28, 30a, 30b, 32a, 32b, 34, 36a, 36b, 38a, 38b, 40a, and 40b, ground conductors 42 and 44, and via-hole conductors v1 through v22.

As shown in FIGS. 1B and 2A through 2D, the multilayer body 12 preferably is formed by stacking insulating layers 16a through 16z and 16aa through 16ii in the vertical direction on each other, and preferably has a rectangular or substantially rectangular parallelepiped shape. The multilayer body 12 includes therein the LC parallel resonators LC1 through LC3, the inductors La and Lb, and the capacitors C4 through C7.

The insulating layers 16a through 16z and 16aa through 16ii, which preferably have a rectangular or substantially rectangular shape, as shown in FIGS. 2A through 2D, are constituted by, for example, a ceramic dielectric. The insulating layers 16a through 16z and 16aa through 16ii are stacked on each other such that they are arranged from the top to the bottom in this order. In the following description, the upper surfaces of the insulating layers 16a through 16z and 16aa through 16ii will be referred to as "top surfaces", and the lower surfaces of the insulating layers 16a through 16z and 16aa through 16ii will be referred to as "bottom surfaces".

The inductor L1 preferably is configured in a spiral shape which turns around a winding axis extending in parallel or substantially in parallel with the longitudinal direction. The inductor L1 is disposed near the front surface of the multilayer body 12. The inductor L1 preferably includes the inductor conductors 18a through 18r and the via-conductors v1 through v5. The inductor conductors 18a through 18c are linear conductor layers disposed on the top surfaces of the insulating layers 16e through 16g, respectively. The inductor conductors 18a through 18c extend, by a small distance, substantially from the center of the short sides at the front of the insulating layers 16e through 16g, respectively, toward the back sides, and then extend toward the left sides. That is, the inductor conductors 18a through 18c are L-shaped or substantially L-shaped conductors. The left end portions of the inductor conductors 18a through 18c are positioned near the left corners of the insulating layers 16e through 16g, respectively.

The inductor conductors 18d through 18f are linear conductor layers disposed on the top surfaces of the insulating layers 16w through 16y, respectively. The inductor conductors 18d through 18f extend along the short sides at the front of the insulating layers 16w through 16y, respectively. The left end portions of the inductor conductors 18d through 18f are superposed on those of the inductor conductors 18a through 18c, as viewed from above.

The inductor conductors 18g through 18i are linear conductor layers disposed on the top surfaces of the insulating layers 16h through 16j, respectively. The inductor conductors 18g through 18i extend along the short sides at the front of the insulating layers 16h through 16j, respectively. The right end portions of the inductor conductors 18g through 18i are superposed on those of the inductor conductors 18d through 18f, as viewed from above.

The inductor conductors 18j through 18l are linear conductor layers disposed on the top surfaces of the insulating layers 16t through 16v, respectively. The inductor conductors 18j through 18l extend along the short sides at the front of the insulating layers 16t through 16v, respectively. The left end portions of the inductor conductors 18j through 18l are superposed on those of the inductor conductors 18g through 18i, as viewed from above.

The inductor conductors 18m through 18o are linear conductor layers disposed on the top surfaces of the insulating layers 16k through 16m, respectively. The inductor conductors 18m through 18o respectively extend substantially from the center of the short sides at the front of the insulating layers 16k through 16m toward the right sides. The right end portions of the inductor conductors 18m through 18o are superposed on those of the inductor conductors 18j through 18l, as viewed from above.

The inductor conductors 18p through 18r are linear conductor layers disposed on the top surfaces of the insulating layers 16q through 16s, respectively. The inductor conductors 18p through 18r respectively extend substantially from the center of the short sides at the front of the insulating layers 16q through 16s toward the back sides. The front end portions of the inductor conductors 18p through 18r are superposed on the left end portions of the inductor conductors 18m through 18o, as viewed from above.

The via-hole conductor v1 is an interlayer connecting conductor which passes through the insulating layers 16e through 16x in the vertical direction. The via-hole conductor v1 is formed preferably by connecting a plurality of via-hole conductors which pass through the respective insulating layers 16e through 16x. The via-hole conductor v1 connects the left end portions of the inductor conductors 18a through 18c and the left end portions of the inductor conductors 18d through 18f.

The via-hole conductor v2 is an interlayer connecting conductor which passes through the insulating layers 16h through 16x in the vertical direction. The via-hole conductor v2 is formed preferably by connecting a plurality of via-hole conductors which pass through the respective insulating layers 16h through 16x. The via-hole conductor v2 connects the right end portions of the inductor conductors 18d through 18f and the right end portions of the inductor conductors 18g through 18i.

The via-hole conductor v3 is an interlayer connecting conductor which passes through the insulating layers 16h through 16u in the vertical direction. The via-hole conductor v3 is formed preferably by connecting a plurality of via-hole conductors which pass through the respective insulating layers 16h through 16u. The via-hole conductor v3 connects the left end portions of the inductor conductors 18g through 18i and the left end portions of the inductor conductors 18j through 18l.

The via-hole conductor v4 is an interlayer connecting conductor which passes through the insulating layers 16k through 16u in the vertical direction. The via-hole conductor v4 is formed preferably by connecting a plurality of via-hole conductors which pass through the respective insulating layers 16k through 16u. The via-hole conductor v4 connects the right end portions of the inductor conductors 18j through 18l and the right end portions of the inductor conductors 18m through 18o.

The via-hole conductor v5 is an interlayer connecting conductor which passes through the insulating layers 16k through 16r in the vertical direction. The via-hole conductor v5 is formed preferably by connecting a plurality of via-hole conductors which pass through the respective insulating layers 16k through 16r. The via-hole conductor v5 connects the left end portions of the inductor conductors 18m through 18o and the front end portions of the inductor conductors 18p through 18r.

The inductor conductors 18a through 18c are partially superposed on the inductor conductors 18d through 18o, as viewed from above. Accordingly, the inductor L1 preferably is configured in a spiral shape which turns clockwise from the outer periphery to the center in substantially the same plane, as viewed from the front side.

The inductor L3 is preferably configured in a spiral shape which turns around a winding axis extending in parallel or substantially in parallel with the longitudinal direction. The inductor L3 is disposed near the back surface of the multilayer body 12. The winding axis of the inductor L3 substantially coincides with that of the inductor L1 in the vertical direction and in the widthwise direction. The structure of the inductor L3 is substantially the same as that of the inductor L1. The inductor L3 preferably includes inductor conductors 26a through 26r and via-hole conductors v10 through v14.

The inductor conductors 26a through 26c are linear conductor layers disposed on the top surfaces of the insulating layers 16q through 16s, respectively. The inductor conductors 26a through 26c extend from portions farther backward than the center of the longitudinal direction of the insulating layers 16q through 16s toward the back sides. The back end portions of the inductor conductors 26a through 26c are positioned near the center of the short sides at the back of the insulating layers 16q through 16s, respectively.

The inductor conductors 26d through 26f are linear conductor layers disposed on the top surfaces of the insulating layers 16k through 16m, respectively. The inductor conductors 26d through 26f extend along the right half portions of the short sides at the back of the insulating layers 16k through 16m, respectively. The left end portions of the inductor conductors 26d through 26f are superposed on the back end portions of the inductor conductors 26a through 26c, as viewed from above.

The inductor conductors 26g through 26i are linear conductor layers disposed on the top surfaces of the insulating layers 16t through 16v, respectively. The inductor conductors 26g through 26i extend along the short sides at the back of the insulating layers 16t through 16v, respectively. The right end portions of the inductor conductors 26g through 26i are superposed on the right end portions of the inductor conductors 26d through 26f, as viewed from above.

The inductor conductors 26j through 26l are linear conductor layers disposed on the top surfaces of the insulating layers 16h through 16j, respectively. The inductor conductors 26j through 26l extend along the short sides at the back of the insulating layers 16h through 16j, respectively. The left end portions of the inductor conductors 26j through 26l are superposed on the left end portions of the inductor conductors 26g through 26i, as viewed from above.

The inductor conductors 26m through 26o are linear conductor layers disposed on the top surfaces of the insulating layers 16w through 16y, respectively. The inductor conductors 26m through 26o extend along the short sides at the back of the insulating layers 16w through 16y, respectively. The right end portions of the inductor conductors 26m through 26o are superposed on the right end portions of the inductor conductors 26j through 26l, as viewed from above.

The inductor conductors 26p through 26r are linear conductor layers disposed on the top surfaces of the insulating layers 16e through 16g, respectively. The inductor conductors 26p through 26r respectively extend from the vicinities of the left corners of the short sides at the back of the insulating layers 16e through 16g toward the right side, and then extend toward the back side by a small distance so as to be led toward the center of the short sides at the back of the insulating layers 16e through 16g. That is, the inductor conductors 26p through 26r are L-shaped or substantially L-shaped conductors. The left end portions of the inductor conductors 26p through 26r are superposed on the left end portions of the inductor conductors 26m through 26o, as viewed from above.

The via-hole conductor v10 is an interlayer connecting conductor which passes through the insulating layers 16k through 16r in the vertical direction. The via-hole conductor v10 is formed preferably by connecting a plurality of via-hole conductors which pass through the respective insulating layers 16k through 16r. The via-hole conductor v10 connects the back end portions of the inductor conductors 26a through 26c and the left end portions of the inductor conductors 26d through 26f.

The via-hole conductor v11 is an interlayer connecting conductor which passes through the insulating layers 16k through 16u in the vertical direction. The via-hole conductor v11 is formed preferably by connecting a plurality of via-hole conductors which pass through the respective insulating layers 16k through 16u. The via-hole conductor v11 connects the right end portions of the inductor conductors 26d through 26f and the right end portions of the inductor conductors 26g through 26i.

The via-hole conductor v12 is an interlayer connecting conductor which passes through the insulating layers 16h through 16u in the vertical direction. The via-hole conductor v12 is formed preferably by connecting a plurality of via-hole conductors which pass through the respective insulating layers 16h through 16u. The via-hole conductor v12 connects the left end portions of the inductor conductors 26g through 26i and the left end portions of the inductor conductors 26j through 26l.

The via-hole conductor v13 is an interlayer connecting conductor which passes through the insulating layers 16h through 16x in the vertical direction. The via-hole conductor v13 is formed preferably by connecting a plurality of via-hole conductors which pass through the respective insulating layers 16h through 16x. The via-hole conductor v13 connects the right end portions of the inductor conductors 26j through 26l and the right end portions of the inductor conductors 26m through 26o.

The via-hole conductor v14 is an interlayer connecting conductor which passes through the insulating layers 16e through 16x in the vertical direction. The via-hole conductor v14 is formed preferably by connecting a plurality of via-hole conductors which pass through the respective insulating layers 16e through 16x. The via-hole conductor v14 connects the left end portions of the inductor conductors 26m through 26o and the left end portions of the inductor conductors 26p through 26r.

The inductor conductors 26p through 26r are partially superposed on the inductor conductors 26d through 26o, as viewed from above. Accordingly, the inductor L3 is formed in a spiral shape which turns counterclockwise from the center to the outer periphery in the same or substantially the same plane, as viewed from the front side.

The inductor L2 preferably is configured to have a helical shape which turns around a winding axis extending in parallel or substantially parallel with the widthwise direction. The inductor L2 is disposed near the center of the longitudinal direction of the multilayer body 2. That is, the inductor L2 is disposed between the inductors L1 and L3. Accordingly, the inductors L1 through L3 are arranged from the front side to the back side in this order.

The inductor L2 is disposed near the left surface of the multilayer body 12. With this arrangement, the center of the inductor L2 in the widthwise direction is positioned toward the left side with respect to the winding axis of the inductor L1 and that of the inductor L3, as viewed from above. In this preferred embodiment, as viewed from above, the inductor L2 protrudes from the inductors L1 and L3 toward the left side and does not protrude from the inductors L1 and L3 toward the right side in the widthwise direction. The winding axis of the inductor L2 intersects with the winding axes of the inductors L1 and L3 substantially at the center (more precisely, the center of the gravity) of the inductors L1 and L3, when viewing the inductors L1 and L3 from the front side.

The inductor L2 preferably includes inductor conductors 22a through 22o and via-hole conductors v6 through v9. The inductor conductors 22a through 22c are linear conductor layers disposed on the top surfaces of the insulating layers 16q through 16s, respectively. The inductor conductors 22a through 22c respectively extend from portions farther forward than the center of the longitudinal direction of the insulating layers 16q through 16s toward the left side. The left end portions of the inductor conductors 22a through 22c are respectively positioned near the long sides at the left of the insulating layers 16q through 16s.

The inductor conductors 22d through 22f are linear conductor layers disposed on the top surfaces of the insulating layers 16b through 16d, respectively. The inductor conductors 22d through 22f extend along the long sides at the left of the insulating layers 16b through 16d, respectively. The front end portions of the inductor conductors 22d through 22f are superposed on the left end portions of the inductor conductors 22a through 22c, as viewed from above.

The inductor conductors 22g through 22i are linear conductor layers disposed on the top surfaces of the insulating layers 16n through 16p, respectively. The inductor conductors 22g through 22i extend along the long sides at the left of the insulating layers 16n through 16p, respectively. However, the inductor conductors 22g through 22i slightly tilt in the longitudinal direction such that they extend toward in the right front direction. The back end portions of the inductor conductors 22g through 22i are superposed on the back end portions of the inductor conductors 22d through 22f, as viewed from above.

The inductor conductors 22j through 22l are linear conductor layers disposed on the top surfaces of the insulating layers 16b through 16d, respectively. The inductor conductors 22j through 22l extend along the long sides at the left of the insulating layers 16b through 16d, respectively, and are positioned on the right side of the inductor conductors 22d and 22f, respectively. The front end portions of the inductor conductors 22j through 22l are superposed on the front end portions of the inductor conductors 22g through 22i, as viewed from above.

The inductor conductors 22m through 22o are linear conductor layers disposed on the top surfaces of the insulating layers 16q through 16s, respectively. The inductor conductors 22m through 22o respectively extend in the widthwise direction from portions farther backward than the center of the longitudinal direction of the insulating layers 16q through 16s. The right end portions of the inductor conductors 22m through 22o are superposed on the back end portions of the inductor conductors 22j through 22l, as viewed from above.

In this manner, the inductor conductors 22d through 22f and the inductor conductors 22j through 22l are disposed from the left side toward the right side in parallel with each other. The inductor conductors 22g through 22i are disposed on the insulating layers positioned lower than the insulating layers on which the inductor conductors 22d through 22f and the inductor conductors 22j through 22l are disposed.

The via-hole conductor v6 is an interlayer connecting conductor which passes through the insulating layers 16b through 16r in the vertical direction. The via-hole conductor v6 is formed preferably by connecting a plurality of via-hole conductors which pass through the respective insulating layers 16b through 16r. The via-hole conductor v6 connects the left end portions of the inductor conductors 22a through 22c and the front end portions of the inductor conductors 22d through 22f.

The via-hole conductor v7 is an interlayer connecting conductor which passes through the insulating layers 16b through 16o in the vertical direction. The via-hole conductor v7 is formed preferably by connecting a plurality of via-hole conductors which pass through the respective insulating layers 16b through 16o. The via-hole conductor v7 connects the back end portions of the inductor conductors 22d through 22f and the back end portions of the inductor conductors 22g through 22i.

The via-hole conductor v8 is an interlayer connecting conductor which passes through the insulating layers 16b through 16o in the vertical direction. The via-hole conductor v8 is formed preferably by connecting a plurality of via-hole conductors which pass through the respective insulating layers 16b through 16o. The via-hole conductor v8 connects the front end portions of the inductor conductors 22g through 22i and the front end portions of the inductor conductors 22j through 22l.

The via-hole conductor v9 is an interlayer connecting conductor which passes through the insulating layers 16b through 16r in the vertical direction. The via-hole conductor v9 is formed preferably by connecting a plurality of via-hole conductors which pass through the respective insulating layers 16b through 16r. The via-hole conductor v9 connects the back end portions of the inductor conductors 22j through 22l and the right end portions of the inductor conductors 22m through 22o.

The inductor L2 configured as described above is preferably configured in a helical shape which advances toward the right side while turning clockwise, as viewed from the left side.

The capacitor C1 preferably includes the capacitor conductors 30a, 30b, and 28. More specifically, the capacitor conductors 30a and 30b are rectangular or substantially rectangular conductor layers which are respectively disposed on the top surfaces of the insulating layers 16z and 16bb, and which are disposed in regions defined by the right half portions in the widthwise direction and the front half portions in the longitudinal direction of the insulating layers 16z and 16bb. The capacitor conductors 30a and 30b extend to the center of the short sides at the front of the insulating layers 16z and 16bb, respectively. The capacitor conductor 28 is a rectangular or substantially rectangular conductor layer which is disposed on the top surface of the insulating layer 16aa and which is disposed in a region defined by a right half portion in the widthwise direction and a front half portion in the longitudinal direction of the insulating layer 16aa. The capacitor conductor 28 is superposed on the capacitor conductors 30a and 30b, as viewed from above. With this arrangement, the capacitor conductor 28 opposes the capacitor conductor 30a with the insulating layer 16z therebetween, and opposes the capacitor conductor 30b with the insulating layer 16aa therebetween.

The capacitor C2 preferably includes the capacitor conductors 32a, 32b, 38a, 38b, 40a, and 40b. More specifically, the capacitor conductors 32a and 32b are rectangular or substantially rectangular conductor layers which are respectively disposed on the top surfaces of the insulating layers 16dd and 16ff, and which are disposed in regions defined by the left half portions in the widthwise direction and the front half portions in the longitudinal direction of the insulating layers 16dd and 16ff. The capacitor conductors 38a and 38b are rectangular or substantially rectangular conductor layers which are respectively disposed on the top surfaces of the insulating layers 16dd and 16ff, and which are disposed in regions defined by the left half portions in the widthwise direction and the back half portions in the longitudinal direction of the insulating layers 16dd and 16ff. The capacitor conductors 40a and 40b are strip-shaped or substantially strip-shaped conductor layers which are respectively disposed on the top surfaces of the insulating layers 16cc and 16ee and which are respectively disposed in regions defined by the left half portions in the widthwise direction of the insulating layers 16dd and 16ff, and extend in the longitudinal direction. The capacitor conductors 40a and 40b are superposed on the capacitor conductors 32a, 32b, 38a, and 38b, as viewed from above. With this arrangement, the capacitor conductors 32a and 38a oppose the capacitor conductor 40a with the insulating layer 16cc therebetween and oppose the conductor 40b with the insulating layer 16dd therebetween, and the capacitor conductors 32b and 38b oppose the capacitor conductor 40b with the insulating layer 16ee therebetween.

The capacitor C3 preferably includes the capacitor conductors 36a, 36b, and 34. More specifically, the capacitor conductors 36a and 36b are rectangular or substantially rectangular conductor layers which are respectively disposed on the top surfaces of the insulating layers 16z and 16bb, and which are disposed in regions defined by the right half portions in the widthwise direction and the back half portions in the longitudinal direction of the insulating layers 16z and 16bb, respectively. The capacitor conductors 36a and 36b extend toward the center of the short sides at the back of the insulating layers 16z and 16bb, respectively. The capacitor conductor 34 is a rectangular or substantially rectangular conductor layer which is disposed on the top surface of the insulating layer 16aa and which is disposed in a region defined by a right half portion in the widthwise direction and a back half portion in the longitudinal direction of the insulating layer 16aa. The capacitor conductor 34 is superposed on the capacitor conductors 36a and 36b, as viewed from above. With this arrangement, the capacitor conductor 34 opposes the capacitor conductor 36a with the insulating layer 16z therebetween, and opposes the capacitor conductor 36b with the insulating layer 16aa therebetween.

The capacitor C4 preferably includes the capacitor conductor 30b and the ground conductor 42. More specifically, the ground conductor 42 is a rectangular or substantially rectangular conductor layer which covers the entire or substantially entire surface of the front half of the insulating layer 16gg, and is superposed on the capacitor conductor 30b, as viewed from above. With this arrangement, the capacitor conductor 30b opposes the ground conductor 42 with the insulating layers 16bb through 16ff therebetween.

The capacitor C5 preferably includes the capacitor conductor 32b and the ground conductor 42. More specifically, the ground conductor 42 is superposed on the capacitor conductor 32b, as viewed from above. With this arrangement, the capacitor conductor 32b opposes the ground conductor 42 with the insulating layer 16ff therebetween.

The capacitor C6 preferably includes the capacitor conductor 38b and the ground conductor 44. More specifically, the ground conductor 44 is a rectangular or substantially rectangular conductor layer which covers the entire or substantially entire surface of the back half of the insulating layer 16gg, and is superposed on the capacitor conductor 38b, as viewed from above. With this arrangement, the capacitor conductor 38b opposes the ground conductor 44 with the insulating layer 16ff therebetween.

The capacitor C7 preferably includes the capacitor conductor 36b and the ground conductor 44. More specifically, the ground conductor 44 is superposed on the capacitor conductor 36b, as viewed from above. With this arrangement, the capacitor conductor 36b opposes the ground conductor 44 with the insulating layers 16bb through 16ff therebetween.

The via-hole conductor v15 is an interlayer connecting conductor which passes through the insulating layers 16q through 16ee in the vertical direction. The via-hole conductor v15 is formed preferably by connecting a plurality of via-hole conductors which pass through the respective insulating layers 16q through 16ee. The via-hole conductor v15 connects the back end portions of the inductor conductors 18p through 18r and the capacitor conductors 28, 32a, and 32b. With this arrangement, the via-hole conductor v15 connects the inductor L1 and the capacitors C1, C2, and C5.

The via-hole conductor v16 is an interlayer connecting conductor which passes through the insulating layers 16q through 16ee in the vertical direction. The via-hole conductor v16 is formed preferably by connecting a plurality of via-hole conductors which pass through the respective insulating layers 16q through 16ee. The via-hole conductor v16 connects the right end portions of the inductor conductors 22a through 22c and the capacitor conductors 28, 32a, and 32b. With this arrangement, the via-hole conductor v16 connects the inductor L2 and the capacitors C1, C2, and C5.

The via-hole conductor v17 is an interlayer connecting conductor which passes through the insulating layers 16q through 16ee in the vertical direction. The via-hole conductor v17 is formed preferably by connecting a plurality of via-hole conductors which pass through the respective insulating layers 16q through 16ee. The via-hole conductor v17 connects the right end portions of the inductor conductors 22m through 22o and the capacitor conductors 38a and 38b.

With this arrangement, the via-hole conductor v17 connects the inductor L2 and the capacitors C2, C3, and C6.

The via-hole conductor v18 is an interlayer connecting conductor which passes through the insulating layers 16q through 16ee in the vertical direction. The via-hole conductor v18 is formed preferably by connecting a plurality of via-hole conductors which pass through the respective insulating layers 16q through 16ee. The via-hole conductor v18 connects the front end portions of the inductor conductors 26a through 26c and the capacitor conductors 34, 38a, and 38b. With this arrangement, the via-hole conductor v18 connects the inductor L3 and the capacitors C2, C3, and C6.

The external terminal 14c is a rectangular or substantially rectangular conductor which is disposed substantially at the center of the bottom surface of the insulating layer 16ii.

The inductor La preferably includes the inductor conductor 46. The inductor conductor 46 is a linear conductor layer which is disposed on the top surface of the insulating layer 16hh. The inductor conductor 46 rotates through almost one revolution in a region defined by the front half of the insulating layer 16hh. However, the inductor conductor 46 is cut half through on a long side of the inductor conductor 46 positioned toward the back side.

The via-hole conductor v19 is an interlayer connecting conductor which passes through the insulating layer 16gg in the vertical direction. The via-hole conductor v19 connects the ground conductor 42 and the right end portion of the inductor conductor 46.

The via-hole conductor v20 is an interlayer connecting conductor which passes through the insulating layers 16hh and 16ii in the vertical direction. The via-hole conductor v20 is formed preferably by connecting a plurality of via-hole conductors which pass through the respective insulating layers 16hh and 16ii. The via-hole conductor v20 connects the left end portion of the inductor conductor 46 and the external terminal 14c. With this arrangement, the inductor La is connected between the capacitors C4 and C5 and the external terminal 14c.

The inductor Lb preferably includes the inductor conductor 48. The inductor conductor 48 is a linear conductor layer which is disposed on the top surface of the insulating layer 16hh. The inductor conductor 48 rotates through almost one revolution in a region defined by the back half of the insulating layer 16hh. However, the inductor conductor 48 is cut half through on a long side of the inductor conductor 48 positioned toward the front side.

The via-hole conductor v21 is an interlayer connecting conductor which passes through the insulating layer 16gg in the vertical direction. The via-hole conductor v21 connects the ground conductor 44 and the right end portion of the inductor conductor 48.

The via-hole conductor v22 is an interlayer connecting conductor which passes through the insulating layers 16hh and 16ii in the vertical direction. The via-hole conductor v22 is formed preferably by connecting a plurality of via-hole conductors which pass through the respective insulating layers 16hh and 16ii. The via-hole conductor v22 connects the left end portion of the inductor conductor 48 and the external terminal 14c. With this arrangement, the inductor Lb is connected between the capacitors C6 and C7 and the external terminal 14c.

The external terminal 14a is disposed, as shown in FIG. 1B, such that it extends in the vertical direction on the front surface of the multilayer body 12. With this arrangement, the external terminal 14a is connected to the inductor conductors 18a through 18c and the capacitor conductors 30a and 30b. That is, the external terminal 14a is connected to the inductor L1 and the capacitors C1 and C4.

The external terminal 14b is disposed, as shown in FIG. 1B, such that it extends in the vertical direction on the back surface of the multilayer body 12. With this arrangement, the external terminal 14b is connected to the inductor conductors 26p through 26r and the capacitor conductors 36a and 36b. That is, the external terminal 14b is connected to the inductor L3 and the capacitors C3 and C7.

A non-limiting example of a manufacturing method for the electronic component 10 will now be discussed below with reference to FIGS. 1B and 2A through 2D.

First, ceramic green sheets, which will be used as the insulating layers 16a through 16z and 16aa through 16ii, are prepared. Then, the via-hole conductors v1 through v22 are formed in the ceramic green sheets which will be used as the insulating layers 16b through 16z and 16aa through 16ii. More specifically, by applying a laser beam to the ceramic green sheets which will be used as the insulating layers 16b through 16z and 16aa through 16ii, via-holes are formed. Then, a conductive paste made of Ag, Pd, Cu, Au, or an alloy thereof is filled into the via-holes preferably by print coating, for example.

Then, a conductive paste made of Ag, Pd, Cu, Au, or an alloy thereof as a principal component is applied to the top surfaces of the ceramic green sheets which will be used as the insulating layers 16b through 16z and 16aa through 16hh by using a screen printing or photolithographic process, thus forming the inductor conductors 18a through 18r, 22a through 22o, 26a through 26r, 46, and 48, the capacitor conductors 28, 30a, 30b, 32a, 32b, 34, 36a, 36b, 38a, 38b, 40a, and 40b, and the ground conductors 42 and 44. A conductive paste may be filled into the via-holes when forming the inductor conductors 18a through 18r, 22a through 22o, 26a through 26r, 46, and 48, the capacitor conductors 28, 30a, 30b, 32a, 32b, 34, 36a, 36b, 38a, 38b, 40a, and 40b, and the ground conductors 42 and 44.

Then, a conductive paste made of Ag, Pd, Cu, Au, or an alloy thereof as a principal component is applied to the bottom surface of the ceramic green sheet which will be used as the insulating layer 16ii by using a screen printing or photolithographic process, thus forming an underlayer electrode which will serve as the external terminal 14c. A conductive paste may be filled into the via-holes when forming an underlayer electrode which will serve as the external terminal 14c.

Then, the ceramic green sheets are stacked on each other. More specifically, the ceramic green sheets which will be used as the insulating layers 16a through 16z and 16aa through 16ii are stacked and pressed on each other one by one. According to the above-described process, a mother multilayer body is formed. Then, this mother multilayer body is subjected to final pressing by, for example, isostatic pressing.

The mother multilayer body is cut into multilayer bodies 12 having a predetermined size by using a cutting blade. Then, barrel polishing is performed on each unfired multilayer body 12, thus chamfering the unfired multilayer body 12. Then, debinding and firing is performed on the unfired multilayer body 12.

Finally, by applying a conductive paste made of Ag, Pd, Cu, Au, or an alloy thereof as a principal component to the top surface of the multilayer body 12, underlayer electrodes which will serve as the external terminals 14a and 14b are formed. Then, Ni-plating or Sn-plating is performed on the top surfaces of the underlayer electrodes which will serve as the external terminals 14a through 14c, thus forming the external terminals 14a through 14c. According to the above-described process, the electronic component 10 is formed. Firing of the multilayer body 12 may be performed after forming the external terminals 14a through 14c. More specifically, the mother multilayer body is cut into the multilayer bodies 12, barrel polishing is performed on each multilayer body 12, the external terminals 14a through 14c are formed by applying a conductive paste, and then, the multilayer body 12 is fired.

By using the electronic component 10 configured as described above, it is possible to reduce the insertion loss. More specifically, in the electronic component 10, the inductor L2 is formed as a helical inductor. Since the air-core diameter of a helical inductor is larger than that of a spiral inductor, it is possible to increase the Q factor of the inductor L2. Additionally, the inductance of the helical inductor L2 is greater than that of a spiral inductor. Thus, it is possible to reduce the insertion loss of the electronic component 10.

In the electronic component 10, a reduction in the insertion loss of the electronic component 10 is achieved also due to the following reason. In the electronic component 10, as viewed from above, the center of the inductor L2 in the widthwise direction of the multilayer body 12 is positioned toward the left side with respect to the winding axes of the inductors L1 and L3. With this arrangement, since the inductor L2 is displaced from the center of the inductors L1 and L3 toward the left side, it is possible to inhibit the inductor L2 from interfering with the magnetic flux generated in the inductors L1 and L3. Thus, the Q factor of the inductors L1 and L3 is increased, and also, it is possible to inhibit the inductor L2 from interfering with magnetic fields generated in the inductors L1 and L3, thus increasing the inductance of each of the inductors L1 and L3. As a result, it is possible to reduce the insertion loss by using the electronic component 10.

Instead of forming the inductors L1 and L3 in a helical shape, the inductor L2, which is disposed substantially at the center of the longitudinal direction of the multilayer body 12, is formed in a helical shape. This makes it possible to more effectively reduce the insertion loss of the electronic component 10. This will be explained below more specifically. The external terminal 14a is disposed near the inductor L1, while the external terminal 14b is disposed near the inductor L3. Accordingly, if the inductors L1 and L3 are formed in a helical shape, the areas by which the inductors L1 and L3 oppose the external terminals 14a and 14b, respectively, are increased. Thus, the stray capacitance generated between the inductors L1 and L3 and the external terminals 14a and 14b, respectively, is increased. As a result, the Q factor of each of the inductors L1 and L3 is decreased.

On the other hand, there is no outer electrode near the inductor L2, which is disposed substantially at the center of the longitudinal direction of the multilayer body 12. Accordingly, even if the inductor L2 is formed in a helical shape, an increase in the stray capacitance generated between the inductor L2 and an outer electrode is significantly reduced or prevented. Additionally, even if the inductor L2 is disposed near the left surface of the multilayer body 12, a magnetic field generated by the inductor L2 is not interfered with by an outer electrode. Thus, a decrease in the Q factor of the inductor L2 is significantly reduced or prevented, and the insertion loss of the electronic component 10 is effectively reduced or prevented.

In the electronic component 10, it is possible to obtain a sufficient attenuation in a band other than the pass band. This will be explained below more specifically. The inductors L1 through L3 are disposed from the front side to the back side of the multilayer body 12 in this order. The inductors L1 and L3 turn around the winding axes which extend in the longitudinal direction of the multilayer body 12, while the inductor L2 turns around the winding axis which extends in the widthwise direction of the multilayer body 12. Accordingly, the winding axes of the inductors L1 and L3 are perpendicular or substantially perpendicular to the winding axis of the inductor L2, thus decreasing electromagnetic coupling between the inductors L1 and L2 and between the inductors L2 and L3. Thus, magnetic coupling between the inductors L1 and L2 and between the inductors L2 and L3 is decreased. As a result, it is possible to obtain a sufficient attenuation in a band other than the pass band.

In the electronic component 10, a sufficient attenuation in a band other than the pass band is obtained also due to the following reason. In the electronic component 10, the inductors L1 through L3 are disposed from the front side to the back side in this order. Additionally, the inductors L1 and L3 are formed as spiral inductors which turn around the winding axes extending in the longitudinal direction of the multilayer body 12. The length of the inductors L1 and L3 formed as spiral inductors in the longitudinal direction is shorter than that of the inductor L2 formed as a helical inductor. Accordingly, the distance between the inductors L1 and L2 and that between the inductors L2 and L3 are greater than those if the inductors L1 and L3 are formed as helical conductors. Thus, electromagnetic coupling between the inductors L1 and L2 and between the inductors L2 and L3 is decreased. As a result, it is possible to obtain a sufficient attenuation in a band other than the pass band.

Figure 3:
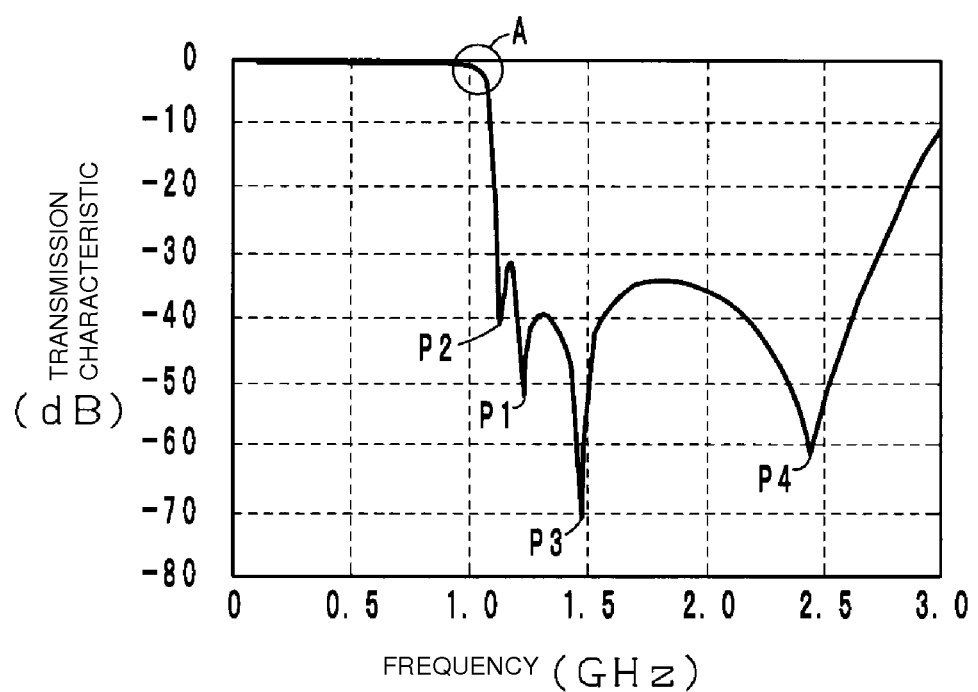
FIG. 3 is a graph illustrating a transmission characteristic of the electronic component shown in FIG. 1A.

In the electronic component 10, it is preferable that the resonant frequency of the LC parallel resonator LC2 is lower than that of each of the LC parallel resonators LC1 and LC3. With this arrangement, when the electronic component 10 is used as a low pass filter, the transmission characteristic of the electronic component 10 sharply falls from the highest frequency of the pass band. FIG. 3 is a graph illustrating the transmission characteristic of the electronic component 10. In FIG. 3, the vertical axis indicates the transmission characteristic, while the horizontal axis indicates the frequency.

This will be explained below more specifically. If the resonant frequency of the LC parallel resonator LC2 is lower than that of each of the LC parallel resonators LC1 and LC3, an attenuation pole P2 is defined by the LC parallel resonator LC2, an attenuation pole P1 is defined by the LC parallel resonator LC1, and an attenuation pole P3 is defined by the LC parallel resonator LC3. The frequency of the attenuation pole P2 is lower than that of each of the attenuation poles P1 and P3, and is positioned near the highest frequency of the pass band. In the electronic component 10 configured as described above, if the inductor L2 of the LC parallel resonator LC2, which defines the attenuation pole P2, is provided as a helical inductor having a high Q factor, the insertion loss near the attenuation pole P2 is significantly reduced. As a result, the transmission characteristic sharply falls from the highest frequency of the pass band, as indicated by A in FIG. 3.

In the electronic component 10, an increase in the attenuation in a band other than the pass band is achieved also due to the following reason. The via-hole conductor v15 connects the inductor L1 and the capacitor C5, while the via-hole conductor v16 connects the inductor L2 and the capacitor C5. That is, the inductors L1 and L2 are connected to the capacitor C5 through different via-hole conductors. If the inductors L1 and L2 are connected to the capacitor C5 through the same via-hole conductor, the inductor L1 and this via-hole conductor define one inductor, and the inductor L2 and this via-hole conductor define one inductor. Thus, the inductors L1 and L2 are electromagnetically coupled with each other through the via-hole conductor, thus increasing the degree of coupling between the inductors L1 and L2.

Because of this reason, in the electronic component 10, as discussed above, the via-hole conductor v15 connects the inductor L1 and the capacitor C5, while the via-hole conductor v16 connects the inductor L2 and the capacitor C5. Accordingly, the inductor L1 and the via-hole conductor v15 define one inductor, and the inductor L2 and the via-hole conductor v16 form one inductor, thus significantly reducing or preventing electromagnetic coupling between the inductors L1 and L2. As a result, the degree of coupling between the inductors L1 and L2 is decreased, thus increasing the attenuation of the electronic component 10. According to a similar principle, the degree of coupling between the inductors L2 and L3 is also decreased.

In the electronic component 10, the via-hole conductor v15 connects the inductor L1 and the capacitors C1 and C2, while the via-hole conductor v16 connects the inductor L2 and the capacitors C2 and C5. Similarly, the via-hole conductor v17 connects the inductor L2 and the capacitors C6 and C2, while the via-hole conductor v18 connects the inductor L3 and the capacitors C2 and C3. With this arrangement, an inductor component between the inductors L1 and L2 and that between the inductors L2 and L3 are decreased, thus significantly reducing or preventing magnetic coupling between the inductors L1 and L2 and between the inductors L2 and L3. As a result, attenuation characteristics are enhanced.

In the electronic component 10, a reduction in the resistance of the inductors L1 through L3 is implemented. This will be explained by taking the inductor L1 as an example. In the inductor L1, the inductors 18a through 18c are connected in parallel with each other, the inductors 18d through 18f are connected in parallel with each other, the inductors 18g through 18i are connected in parallel with each other, the inductors 18j through 18l are connected in parallel with each other, the inductors 18m through 18o are connected in parallel with each other, and the inductors 18p through 18r are connected in parallel with each other. With this arrangement, a reduction in the resistance of the inductor L1 is implemented. A reduction in the resistances of the inductors L2 and L3 is also implemented due to the same reason.

In the electronic component 10, when a current flows through the inductors L1 through L3, the direction in which the current flows through the inductor L1 is opposite to that of the inductor L3, thus decreasing electromagnetic coupling between the inductors L1 and L3.

In the electronic component 10, the capacitors C4 through C7 are disposed. Among high frequency signals which pass through the LC parallel resonators LC1 through LC3, high frequency signals having a frequency higher than the pass band flow to a ground via the capacitors C4 through C7. This makes it possible to further enhance the function of the electronic component 10 as a low pass filter.

In the electronic component 10, the inductor La is disposed between a node between the capacitors C4 and C5 and the external terminal 14c, while the inductor Lb is disposed between a node between the capacitors C6 and C7 and the external terminal 14c. With this arrangement, the capacitors C4 and C5 and the inductor La define an LC series resonator, while the capacitors C6 and C7 and the inductor Lb define an LC series resonator. As a result, an attenuation pole P4 shown in FIG. 3 is provided.

FIRST MODIFIED EXAMPLE

Figure 2A:
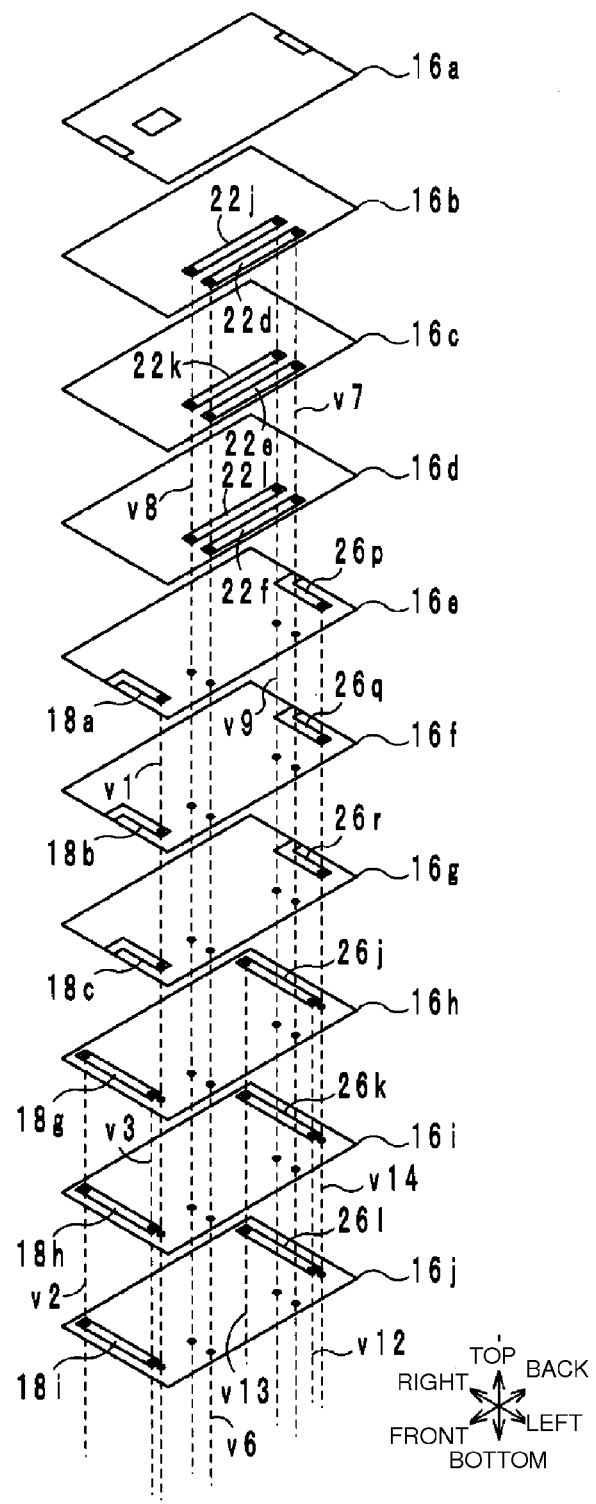
FIGS. 2A through 2D are exploded perspective views of a multilayer body of the electronic component shown in FIG. 1A.
Figure 2B:
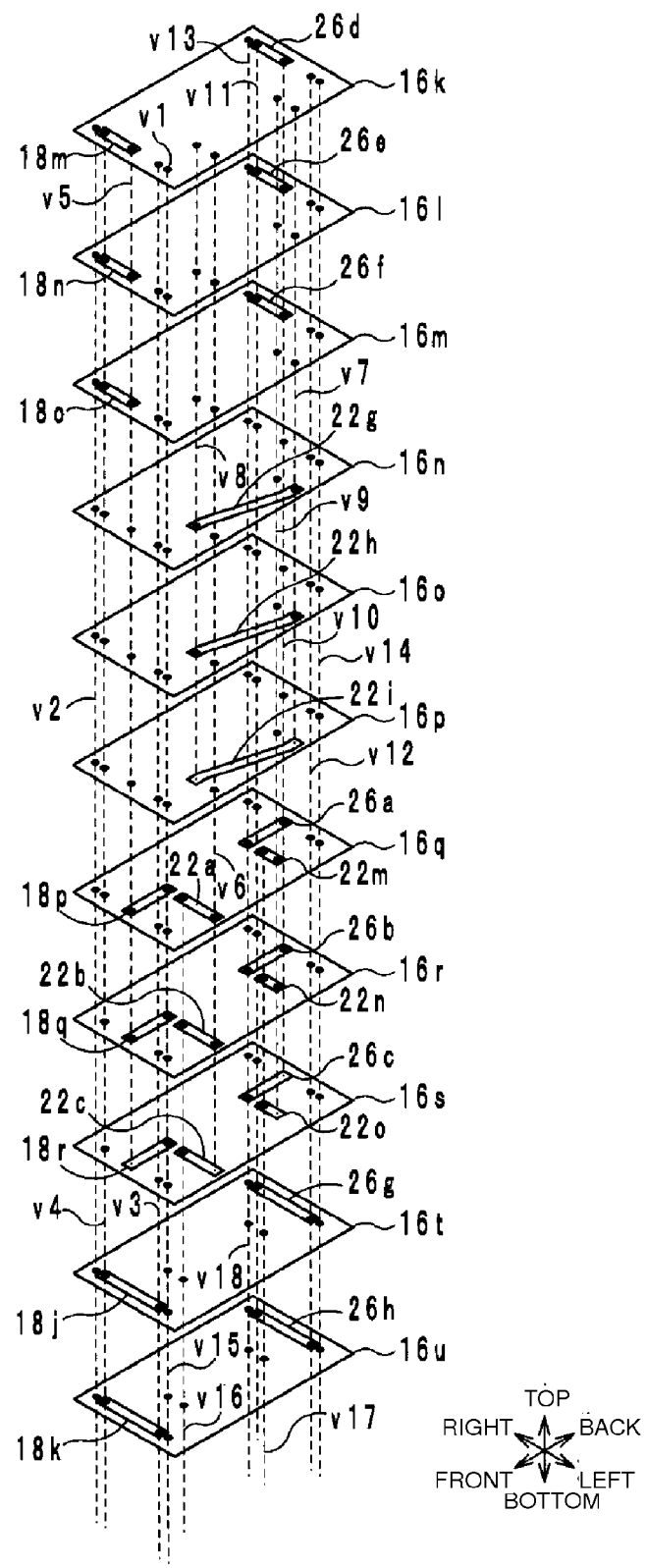
Figure 2C:
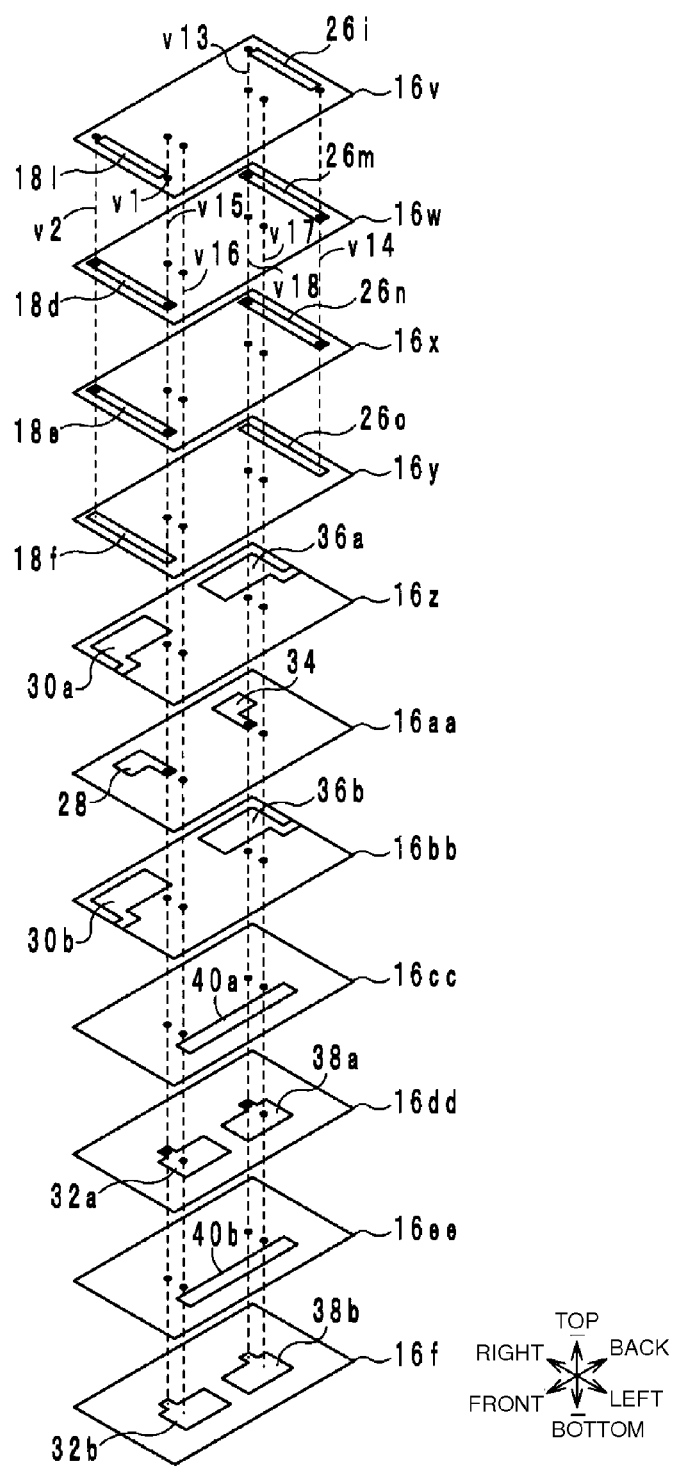
Figure 2D:
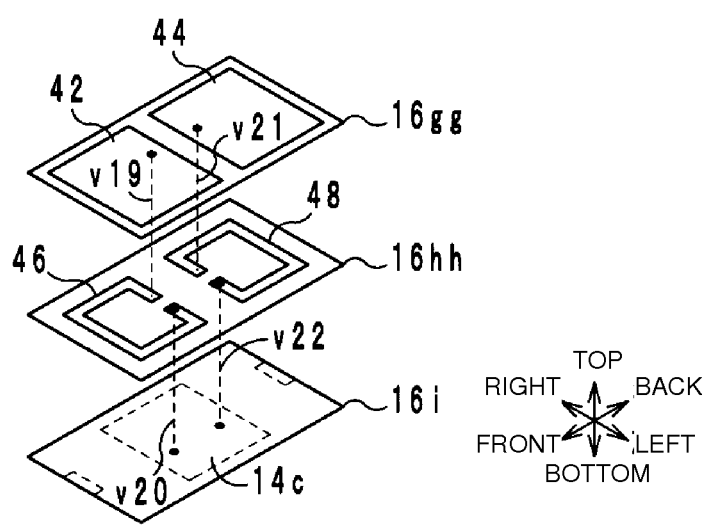
Figure 4:
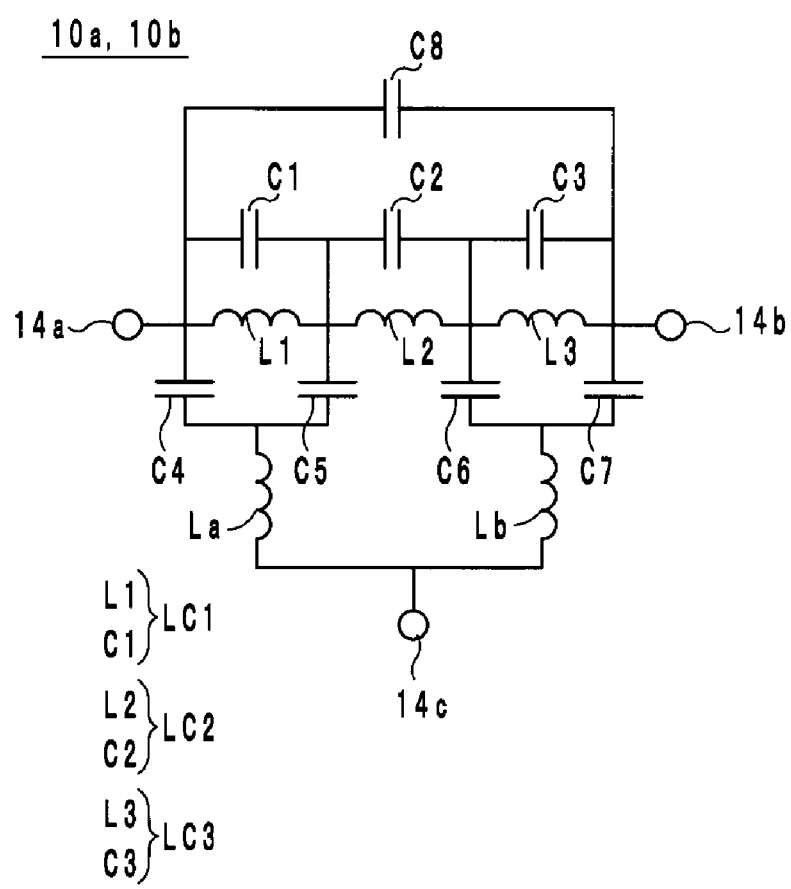
FIG. 4 is an equivalent circuit diagram of an electronic component according to a first modified example of a preferred embodiment of the present invention.
Figure 5:
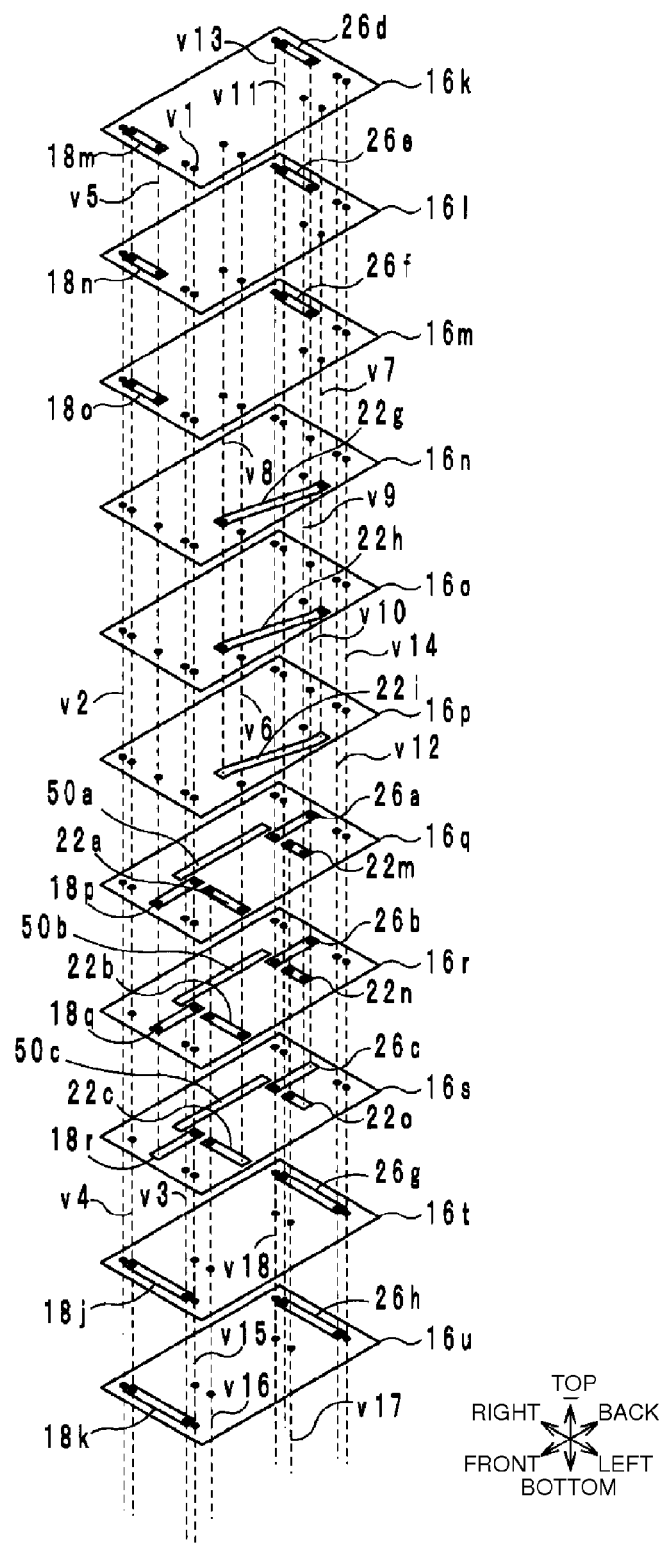
FIG. 5 is an exploded perspective view of a multilayer body of the electronic component shown in FIG. 4.

The configuration of a filter according to a first modified example of a preferred embodiment of the present invention will be described below with reference to FIGS. 4 and 5. FIG. 4 is an equivalent circuit diagram of an electronic component 10a according to the first modified example. FIG. 5 is an exploded perspective view of a multilayer body 12 of the electronic component 10a according to the first modified example. The exploded perspective view of FIG. 5 corresponds to that of FIG. 2B showing the multilayer body 12 of the electronic component 10. The other exploded perspective views of the electronic component 10a are the same as those of the electronic component 10 (FIGS. 2A, 2C, and 2D).

The electronic component 10a is different from the electronic component 10 in that it includes a capacitor C8. The electronic component 10a will be described below by mainly referring to this different point.

The capacitor C8 is connected between the external terminals 14a and 14b, as shown in FIG. 4. The capacitor C8 preferably includes the capacitor conductors 30a, 30b, 36a, 36b, and 50a through 50c, as shown in FIGS. 2C and 5. The capacitor conductors 50a through 50c are strip-shaped or substantially strip-shaped conductor layers which are disposed on the top surfaces of the insulating layers 16q through 16s, respectively, and which extend in the longitudinal direction of the multilayer body 12. The front end portions and surrounding portions of the capacitor conductors 50a through 50c are superposed on the capacitor conductors 30a and 30b, as viewed from above. The back end portions and surrounding portions of the capacitor conductors 50a through 50c are superposed on the capacitor conductors 36a and 36b, as viewed from above. With this arrangement, the capacitor C8 is provided between the capacitor conductors 30a and 30b and the capacitor conductors 36a and 36b via the capacitor conductors 50a through 50c. The capacitor conductors 30a and 30b are connected to the external terminal 14a, while the capacitor conductors 36a and 36b are connected to the external terminal 14b. Accordingly, the capacitor C8 is connected between the external terminals 14a and 14b. The configurations of the other elements of the electronic component 10a are the same as those of the electronic component 10, and thus, an explanation thereof will be omitted.

By using the electronic component 10a, in addition to the advantages obtained by the electronic component 10, it is possible to significantly reduce or prevent the occurrence of rebounding between the attenuation poles P1 and P2 in the transmission characteristic.

This will be explained below more specifically. In the electronic component 10a, the winding axes of the inductors L1 and L3 are perpendicular or substantially perpendicular to the winding axis of the inductor L2. Additionally, as viewed from above, the center of the inductor L2 in the widthwise direction of the multilayer body 12 is positioned toward the left side with respect to the winding axes of the inductors L1 and L3. Accordingly, electromagnetic coupling between the inductors L1 and L2 and between the inductors L2 and L3 is decreased. As a result, magnetic coupling between the inductors L1 and L2 and between the inductors L2 and L3 is significantly reduced or prevented. It is thus possible to obtain a sufficient attenuation in a band other than a pass band of the electronic component 10a.

However, since it is possible to inhibit the inductor L2 from interfering with the magnetic flux generated in the inductors L1 and L3, the inductors L1 and L3 may be magnetically coupled with each other. As a result, the attenuation pole P1 provided by the inductor L1 and the attenuation pole P3 provided by the inductor L3 may be separated farther away from each other. This may cause the occurrence of rebounding between the attenuation poles P1 and P3 in the transmission characteristic.

Because of this reason, in the electronic component 10a, the capacitor C8 is connected between the external terminals 14a and 14b. The external terminal 14a is connected to the inductor L1, while the external terminal 14b is connected to the inductor L3. Thus, by the provision of the capacitor C8, capacitive coupling between the inductors L1 and L3 is increased, while magnetic coupling between the inductors L1 and L3 is decreased. As a result, the attenuation poles P1 and P3 approach closer to each other, thus decreasing or preventing the occurrence of rebounding between the attenuation poles P1 and P3 in the transmission characteristic.

SECOND MODIFIED EXAMPLE

Figure 6:
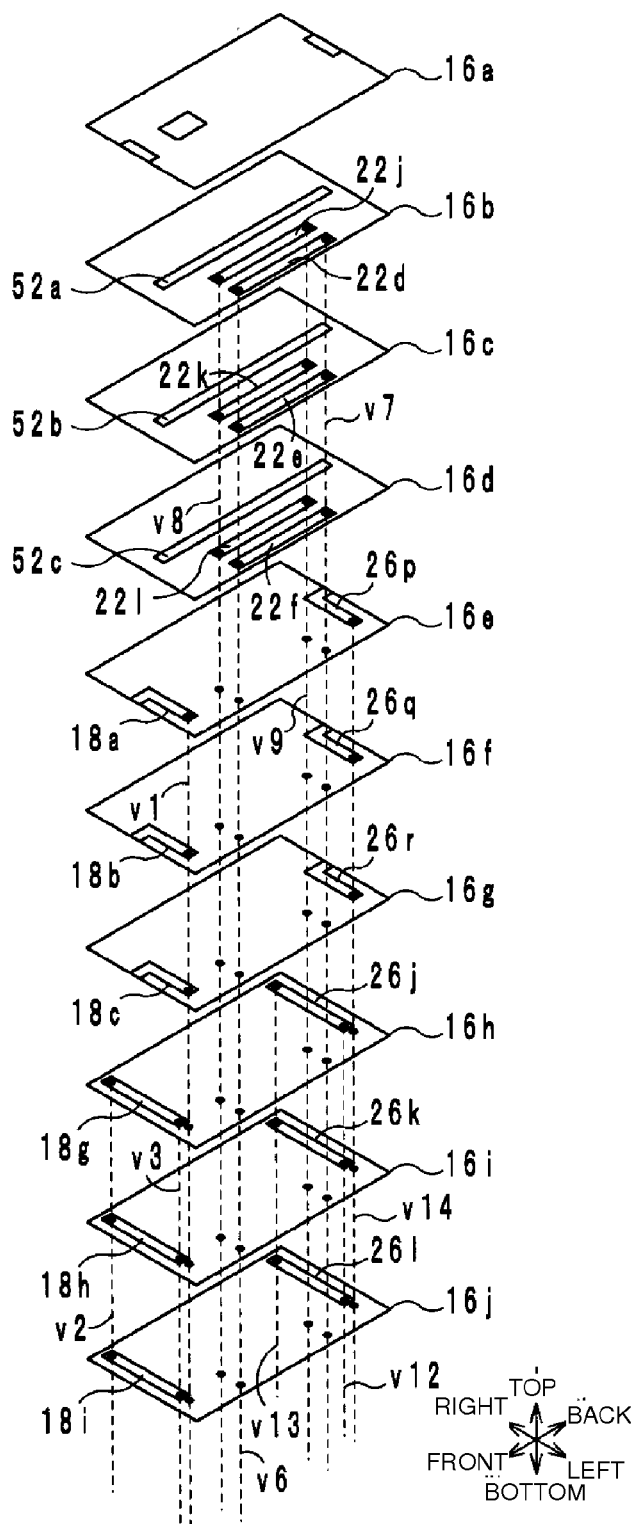
FIG. 6 is an exploded perspective view of a multilayer body of an electronic component according to a second modified example of a preferred embodiment of the present invention.

The configuration of a filter according to a second modified example of a preferred embodiment of the present invention will be described below with reference to FIG. 6. FIG. 6 is an exploded perspective view of a multilayer body 12 of an electronic component 10b according to the second modified example. The exploded perspective view of FIG. 6 corresponds to that of FIG. 2A showing the multilayer body 12 of the electronic component 10. The other exploded perspective views of the electronic component 10b are the same as those of the electronic component 10 (FIGS. 2B through 2D). The equivalent circuit diagram of the electronic component 10b is the same as that of the electronic component 10a, and thus, FIG. 4 will be used for describing the electronic component 10b.

The electronic component 10b, as well as the electronic component 10a, is different from the electronic component 10 in that it includes a capacitor C8. The electronic component 10b will be described below by mainly referring to this different point.

The capacitor C8 is connected between the external terminals 14a and 14b, as shown in FIG. 4. The capacitor C8 preferably includes the inductor conductors 18a through 18c and 26p through 26r and capacitor conductors 52a through 52c, as shown in FIG. 6. The capacitor conductors 52a through 52c are strip-shaped or substantially strip-shaped conductor layers which are disposed on the top surfaces of the insulating layers 16b through 16d, respectively, and which extend in the longitudinal direction of the multilayer body 12. The front end portions and surrounding portions of the capacitor conductors 52a through 52c are superposed on the inductor conductors 18a through 18c, as viewed from above. The back end portions and surrounding portions of the capacitor conductors 52a through 52c are superposed on the inductor conductors 26p through 26r, as viewed from above. With this arrangement, the capacitor C8 is provided between the inductor conductors 18a through 18c and the inductor conductors 26p through 26r via the capacitor conductors 52a through 52c. The inductor conductors 18a through 18c are connected to the external terminal 14a, while the inductor conductors 26p through 26r are connected to the external terminal 14b. Accordingly, the capacitor C8 is connected between the external terminals 14a and 14b. The configurations of the other elements of the electronic component 10b are the same as those of the electronic component 10, and thus, an explanation thereof will be omitted.

By using the electronic component 10b, as well as the electronic component 10a, it is possible to significantly reduce or prevent the occurrence of rebounding between the attenuation poles P1 and P2 in the transmission characteristic.

Other Preferred Embodiments

An electronic component according to a preferred embodiment of the present invention is not restricted to the electronic components 10, 10a, and 10b, and may be modified within the scope of the present invention.

The number of LC parallel resonators is not restricted to three, and may be more. If n LC parallel resonators LC1 through LCn are disposed, inductors L1 and Ln, which are positioned at both ends in the longitudinal direction, of the LC parallel resonators LC1 and LCn respectively turn around the winding axes of the inductors L1 and Ln extending in the longitudinal direction of the multilayer body 12. At least one of the inductors of the LC parallel resonators LC2 through LCn−1 turns around the winding axis of this inductor extending in the widthwise direction of the multilayer body 12.

In the above-described preferred embodiments, the winding axes of the inductors L1 and L3 preferably are parallel with the longitudinal direction of the multilayer body 12. However, the winding axes of the inductors L1 and L3 may be slightly displaced from the longitudinal direction of the multilayer body 12. That is, it is sufficient if the winding axes of the inductors L1 and L3 extend along the longitudinal direction of the multilayer body 12.

In the above-described preferred embodiments, the winding axis of the inductor L2 preferably is parallel with the widthwise direction of the multilayer body 12. However, the winding axis of the inductor L2 may be slightly displaced from the widthwise direction of the multilayer body 12. That is, it is sufficient if the winding axis of the inductor L2 extends along the widthwise direction of the multilayer body 12.

When a current flows through the inductors L1 through L3, the direction in which the current flows through the inductor L1 may be the same as that of the inductor L3, thus increasing electromagnetic coupling between the inductors L1 and L3.

In the electronic component 10, the inductor conductors 22d through 22f and the inductor conductors 22j through 22l are respectively disposed on the same insulating layers 16b through 16d. Alternatively, the inductor conductors 22d through 22f and the inductor conductors 22j through 22l may be distributed among the different insulating layers 16b through 16d. In this manner, by changing the vertical positions of the inductor conductors 22d through 22f and the inductor conductors 22j through 22l, the air-core diameter of the inductor L2 is adjusted, thus adjusting the inductance of the inductor L2.

It is not necessary that the inductor L2 be superposed on the inductors L1 and L3, as viewed from the right side. In this manner, it is possible to more effectively inhibit the inductor L2 from interfering with the magnetic flux generated in the inductors L1 and L3.

The inductors L1 and L3 may be configured to have a helical shape, and the inductor L2 may be configured to have a spiral shape, for example.

It is not necessary that the winding axis of the inductor L1 coincide with that of the inductor L3 in the vertical direction and in the widthwise direction of the multilayer body 12.

When manufacturing the electronic component 10, barrel polishing may be performed on the multilayer body 12 after the external terminals 14a and 14b are formed.

It is sufficient if at least one of the capacitors C4 through C7 is provided.

The configurations of the electronic components 10, 10a, and 10b may be combined in any desired manner.

Preferred embodiments of the present invention are suitably used as an electronic component since it is possible to obtain a sufficient attenuation in a band other than a pass band while insertion loss is being reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   a device body; and
   first through n-th LC parallel resonators connected in series with each other, where n is an integer equal to three or more; wherein
   the first through the n-th LC parallel resonators respectively include first through n-th inductors and first through n-th capacitors;
   the first through the n-th inductors are disposed in the device body so as to be sequentially arranged in a first direction in an order from the first inductor to the n-th inductor;
   the first and the n-th inductors are wound around respective winding axes extending along the first direction;
   at least one predetermined inductor among the second through the (n−1)-th inductors is wound around a winding axis extending in a second direction which is perpendicular or substantially perpendicular to the first direction;
   a center of the at least one predetermined inductor in the second direction is positioned toward one side of the second direction with respect to the winding axes of the first and the n-th inductors, as viewed from a plane of the device body in a third direction which is perpendicular or substantially perpendicular to the first and second directions; and
   as viewed from the plane of the device body in the third direction, the at least one predetermined inductor protrudes from the first and the n-th inductors toward one side of the second direction and does not protrude from the first and the n-th inductors toward the other side of the second direction.

2. The electronic component according to claim 1, wherein the electronic component is a low pass filter.

3. The electronic component according to claim 1, wherein the at least one predetermined inductor is superposed on neither of the first inductor nor the n-th inductor, as viewed from a plane of the device body in the first direction.

4. The electronic component according to claim 1, wherein n is equal to three.

5. The electronic component according to claim 4, wherein a resonant frequency of the second LC parallel resonator is lower than a resonant frequency of the first LC parallel resonator and a resonant frequency of the third LC parallel resonator.

6. The electronic component according to claim 4, further comprising:

an input terminal that is disposed on a top surface of the device body and that is connected to the first LC parallel resonator;
an output terminal that is disposed on the top surface of the device body and that is connected to the third LC parallel resonator;
a ground terminal disposed on a bottom surface of the device body; and
an (n+1)-th capacitor disposed between a node between the input terminal and the first LC parallel resonator and the ground terminal, between a node between the first and second LC parallel resonators and the ground terminal, between a node between the second and third LC parallel resonators and the ground terminal, or between a node between the third LC parallel resonator and the output terminal and the ground terminal.

7. The electronic component according to claim 6, further comprising an additional inductor disposed between the (n+1)-th capacitor and the ground terminal.

8. The electronic component according to claim 6, wherein:
   the device body includes a plurality of insulating layers stacked on each other in the third direction; and
   the capacitors and the inductors of the first, second and third LC parallel resonators include internal conductors disposed on the plurality of insulating layers and the inductors of the first, second and third LC parallel resonators further include interlayer connecting conductors which pass through the plurality of insulating layers in the third direction.

9. The electronic component according to claim 8, wherein
   the (n+1)-th capacitor is disposed between the node between the first and the second LC parallel resonators and the ground terminal; and
   the electronic component further comprises:
      a first interlayer connecting conductor that electrically connects the first inductor and the (n+1)-th capacitor; and
      a second interlayer connecting conductor that electrically connects the second inductor and the (n+1)-th capacitor.

10. The electronic component according to claim 8, wherein at least one of the first, second, and third inductors includes a plurality of internal conductors connected in parallel with each other.

11. The electronic component according to claim 8, wherein:
   the second inductor includes:
      a plurality of first inductor conductors that are disposed on an insulating layer of the device body and that are arranged in parallel or substantially in parallel with each other in the second direction;
      a plurality of second inductor conductors that are arranged to extend along the first direction, that are disposed on an insulating layer of the device body positioned farther toward one side of the third direction than the insulating layer on which the plurality of first inductor conductors are disposed, and that are configured such that, as viewed from a plane of the device body in the third direction, one end portion of each of the plurality of second inductor conductors is superposed on one end portion of the first inductor conductor which is positioned on one side of the second direction, and the other end portion of each of the plurality of second inductor conductors is superposed on the other end portion of the first inductor conductor which is positioned on the other side of the second direction;
a third interlayer connecting conductor that connects one end portion of the first inductor conductor which is positioned on one side of the second direction and one end portion of each of the plurality of second inductor conductors; and
a fourth interlayer connecting conductor that connects the other end portion of the first inductor conductor which is positioned on the other side of the second direction and the other end portion of each of the plurality of second inductor conductors; and
the plurality of first inductor conductors are distributed among a plurality of the insulating layers.

12. The electronic component according to claim 4, further comprising:
an input terminal that is disposed on a top surface of the device body and that is connected to the first LC parallel resonator;
an output terminal that is disposed on the top surface of the device body and that is connected to the third LC parallel resonator; and
an (n+2)-th capacitor disposed between the input terminal and the output terminal.

13. The electronic component according to claim 1, wherein the first inductor and the n-th inductor are spiral shaped or substantially spiral shaped, and the at least one predetermined inductor is helical shaped or substantially helical shaped.

14. The electronic component according to claim 1, wherein the first inductor, the n-th inductor, and the at least one predetermined inductor are helical shaped or substantially helical shaped.

15. The electronic component according to claim 1, wherein, when a current flows through the first through the n-th inductors, a direction in which the current flows through the first inductor is opposite to a direction in which the current flows through the n-th inductor.

16. The electronic component according to claim 1, further comprising an additional capacitor connected between external terminals of the electronic component.

17. The electronic component according to claim 16, wherein the capacitor between the external terminals of the electronic component includes a plurality of strip-shaped or substantially strip-shaped capacitor conductors.

18. The electronic component according to claim 16, wherein the capacitor between the external terminals of the electronic component includes a plurality of inductor conductors and a plurality of capacitor conductors.

* * * * *